(12) United States Patent
Glass et al.

(10) Patent No.: US 10,573,750 B2
(45) Date of Patent: Feb. 25, 2020

(54) METHODS OF FORMING DOPED SOURCE/DRAIN CONTACTS AND STRUCTURES FORMED THEREBY

(71) Applicant: Intel Corporation, Santa Clara, CA (US)

(72) Inventors: Glenn Glass, Portland, OR (US); Karthik Jambunathan, Portland, OR (US); Anand Murthy, Portland, OR (US); Chandra Mohapatra, Beaverton, OR (US); Seiyon Kim, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/779,485

(22) PCT Filed: Dec. 24, 2015

(86) PCT No.: PCT/US2015/000352
§ 371 (c)(1),
(2) Date: May 25, 2018

(87) PCT Pub. No.: WO2017/111806
PCT Pub. Date: Jun. 29, 2017

(65) Prior Publication Data
US 2018/0261696 A1    Sep. 13, 2018

(51) Int. Cl.
*H01L 29/78* (2006.01)
*H01L 29/66* (2006.01)
*H01L 29/165* (2006.01)

(52) U.S. Cl.
CPC ........ *H01L 29/7848* (2013.01); *H01L 29/165* (2013.01); *H01L 29/66795* (2013.01); *H01L 29/785* (2013.01)

(58) Field of Classification Search
CPC ... H01L 29/785; H01L 29/7858; H01L 29/36; H01L 29/365; H01L 29/161;
(Continued)

(56) References Cited

U.S. PATENT DOCUMENTS 8,232,191 B2 * 7/2012 Fukuda ............ H01L 21/02381
                                                       438/191
8,264,032 B2 * 9/2012 Yeh .................. H01L 29/66795
                                                       257/327

(Continued)

FOREIGN PATENT DOCUMENTS

WO    2011101463    8/2011

OTHER PUBLICATIONS

International Search Report and Written Opinion from PCT/US2015/000352 dated Aug. 24, 2016, 14 pgs.
(Continued)

*Primary Examiner* — Scott B Geyer
(74) *Attorney, Agent, or Firm* — Green, Howard & Mughal LLP (57) ABSTRACT

Methods of forming germanium channel structure are described. An embodiment includes forming a germanium fin on a substrate, wherein a portion of the germanium fin comprises a germanium channel region, forming a gate material on the germanium channel region, and forming a graded source/drain structure adjacent the germanium channel region. The graded source/drain structure comprises a germanium concentration that is higher adjacent the germanium channel region than at a source/drain contact region.

21 Claims, 10 Drawing Sheets

(58) Field of Classification Search
CPC ... H01L 29/165; H01L 29/16; H01L 29/1604; H01L 29/086; H01L 29/0865; H01L 29/0869; H01L 29/0878; H01L 29/0882; H01L 29/0886
See application file for complete search history.

(56) References Cited

U.S. PATENT DOCUMENTS

| | | | |
|---|---|---|---|
| 9,202,920 B1 | 12/2015 | Liu et al. | |
| 9,343,300 B1* | 5/2016 | Jacob | H01L 29/66553 |
| 2007/0241399 A1 | 10/2007 | Irisawa et al. | |
| 2008/0001171 A1* | 1/2008 | Tezuka | H01L 21/823807 257/191 |
| 2010/0155790 A1 | 6/2010 | Lin | |
| 2011/0049568 A1* | 3/2011 | Lochtefeld | H01L 21/02381 257/190 |
| 2011/0068407 A1* | 3/2011 | Yeh | H01L 21/823807 257/369 |
| 2012/0012932 A1 | 1/2012 | Perng et al. | |
| 2012/0138886 A1* | 6/2012 | Kuhn | B82Y 10/00 257/9 |
| 2013/0248930 A1* | 9/2013 | Shimamune | H01L 21/02381 257/192 |
| 2013/0277752 A1* | 10/2013 | Glass | H01L 21/823821 257/369 |
| 2014/0070377 A1* | 3/2014 | Yu | C30B 25/165 257/655 |
| 2014/0110755 A1 | 4/2014 | Colinge | |
| 2014/0151761 A1 | 6/2014 | Hsieh et al. | |
| 2014/0167163 A1 | 6/2014 | Cheng et al. | |
| 2014/0264492 A1* | 9/2014 | Lee | H01L 29/66803 257/288 |
| 2015/0145003 A1* | 5/2015 | Rodder | H01L 29/785 257/192 |
| 2015/0243756 A1* | 8/2015 | Obradovic | H01L 29/66795 438/285 |
| 2015/0270284 A1* | 9/2015 | Chou | H01L 27/1203 257/347 |
| 2016/0087053 A1* | 3/2016 | Kim | H01L 29/41783 |
| 2016/0087098 A1* | 3/2016 | Liu | H01L 29/0847 257/344 |
| 2016/0190317 A1* | 6/2016 | Liu | H01L 29/7848 257/192 |
| 2016/0204256 A1* | 7/2016 | Jackson | H01L 29/32 |
| 2016/0380001 A1* | 12/2016 | Bedell | H01L 21/845 257/506 |
| 2017/0012124 A1* | 1/2017 | Glass | B82Y 10/00 |
| 2017/0092765 A1* | 3/2017 | Doris | H01L 29/7851 |

OTHER PUBLICATIONS

International Preliminary Report on Patentability from PCT/US2015/000352 dated Jul. 5, 2018, 11 pgs.
Extended European Search Report from European Patent Application No. 15911509.6 dated Nov. 18, 2019, 9 pgs.

* cited by examiner

METHODS OF FORMING DOPED SOURCE/DRAIN CONTACTS AND STRUCTURES FORMED THEREBY

BACKGROUND OF THE INVENTION

Microelectronic devices, such as devices utilizing germanium in channel structures, may exhibit contact resistance issues. Increased performance of circuit devices including transistors, diodes, resistors, capacitors, and other passive and active electronic devices formed on a semiconductor substrate is typically a major factor considered during design, manufacture, and operation of those devices. For example, during design and manufacture or forming of metal-oxide-semiconductor (MOS) and tunneling field effect (TFET) transistor devices, such as those used in complementary metal-oxide-semiconductor (CMOS) devices, it is often desired to minimize resistance associated with source/drain regions and contacts.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them.

Implementations of the embodiments herein may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope.

A plurality of transistors, such as metal-oxide-semiconductor field-effect transistors (MOSFET or simply MOS transistors), may be fabricated on the substrate. In various implementations, the MOS transistors may be planar transistors, nonplanar transistors, or a combination of both. Nonplanar transistors include FinFET transistors such as double-gate transistors and tri-gate transistors, TFET and wrap-around or all-around gate transistors such as nanoribbon and nanowire transistors.

Each transistor may include a gate stack formed of at least two layers, for example, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc.

The gate electrode layer may be formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

Source and drain regions may be formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process.

In an embodiment, the substrate may first be etched to form recesses at the locations of the source and drain regions. A deposition process, such as an epitaxial process for example, may then be carried out to fill the recesses with material that is used to fabricate the source and drain structures, as will be discussed in more detail with respect to the various embodiments included herein. In some implementations, the source and drain structures may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain structures may be formed using one or more alternate semiconductor materials such as germanium or a group III-V material or alloy.

One or more interlayer dielectrics (ILD) are deposited over/within the MOS transistor structures. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Non-planar transistors, such as a tri-gate transistor structures, may include at least one non-planar transistor fin. The non-planar transistor fin may have a top surface and a pair of laterally opposite sidewalls, as will be depicted further herein. At least one non-planar gate electrode 126 may be formed over the non-planar transistor fin. The non-planar transistor gate electrode may be fabricated by forming a gate dielectric layer on or adjacent to the non-planar transistor fin top surface and on or adjacent to the non-planar transistor fin sidewalls. In an embodiment, the non-planar transistor fin may run in a direction substantially perpendicular to the non-planar transistor gate. Source/drain structures may be formed in the non-planar transistor fin on opposite sides of the gate electrode. In an embodiment, the source and drain structures may be formed by removing portion of the non-planar transistor fins and replacing these portions with appropriate material(s) to form the source and drain structures. Other methods or combination of methods, may be utilized to form the source/drain structures, according to the particular application.

Embodiments of methods of forming microelectronic device structures, such as methods of forming germanium channel source/drain contact structures, are described herein. Those methods/structures may include forming a germanium fin on a substrate, forming a gate electrode on a channel portion of the germanium fin, and forming graded source/drain structures adjacent to the germanium channel region, wherein a germanium rich portion of the graded source/drain structure is formed adjacent the germanium channel region, and wherein the graded source/drain structure comprises a lower germanium concentration a distance farther away from the germanium channel region, and wherein a silicon rich portion is formed adjacent a source/drain contact region. The methods herein significantly reduce or eliminate high contact resistance that may be associated with germanium channel n-type devices.

Figure 1A:
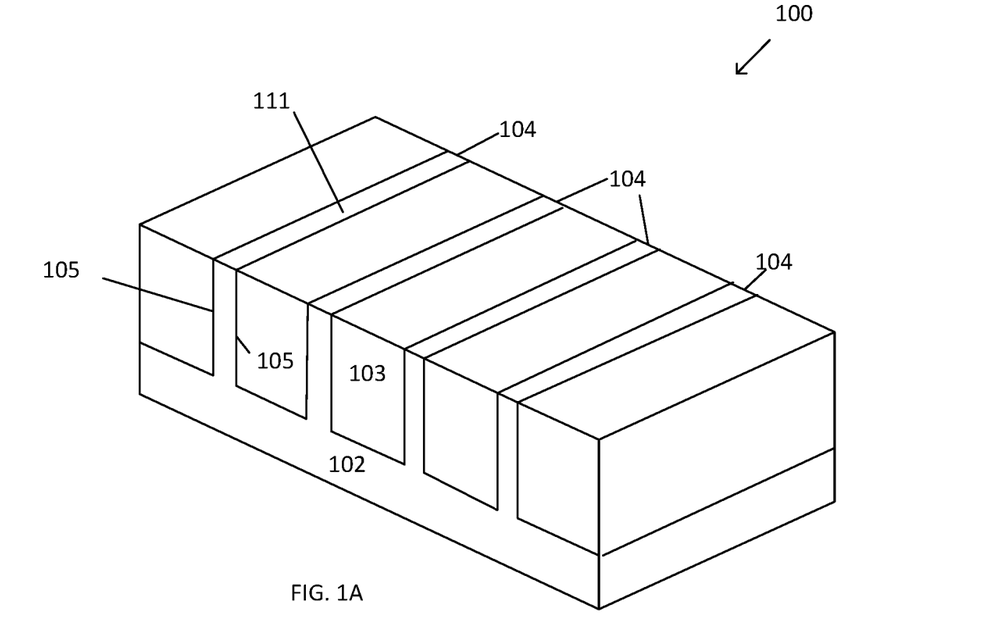
FIG. 1A-1H and 1J-1N represent side cross-sectional views of a structures according to embodiments.
Figure 1B:
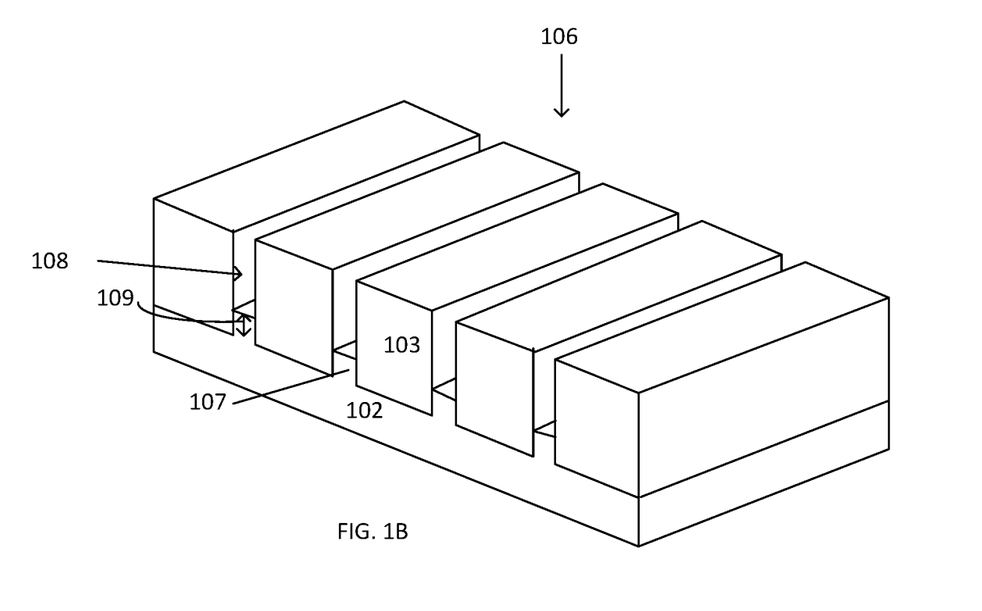
Figure 1C:
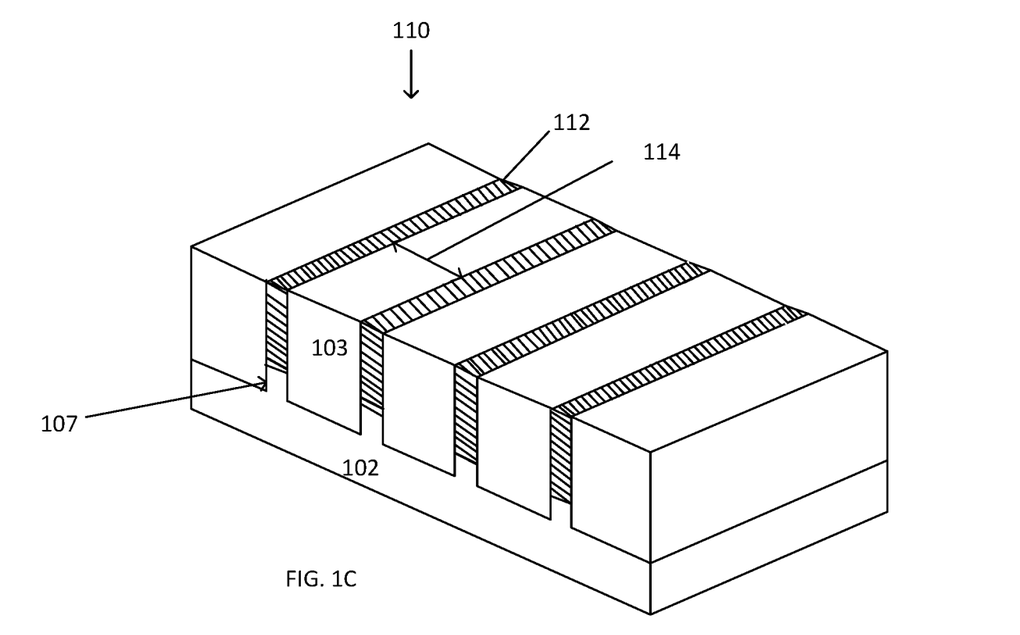
Figure 1D:
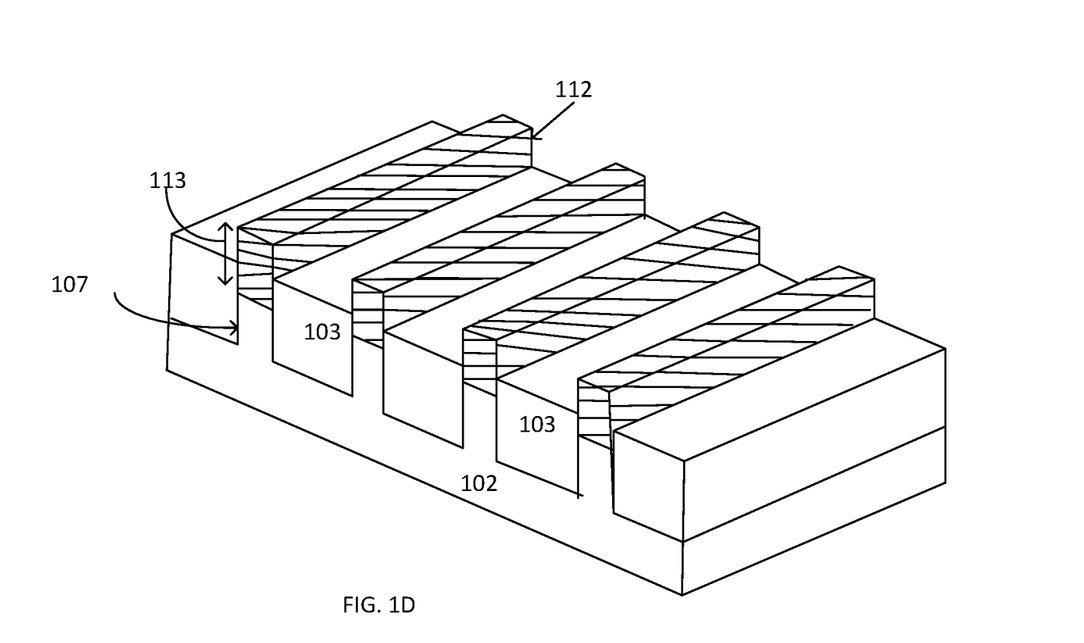
Figure 1E:
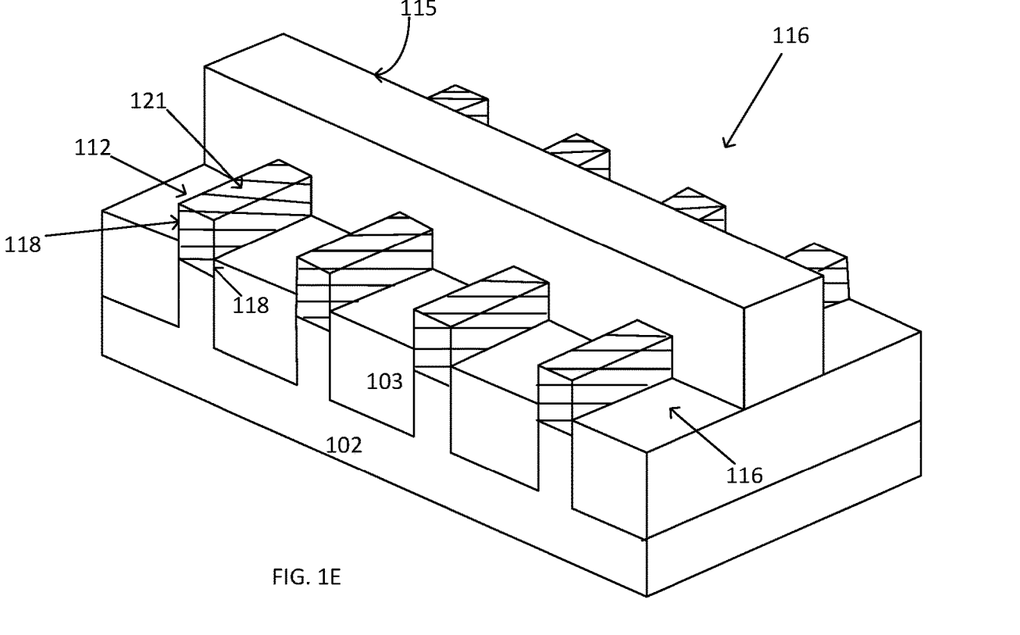
Figure 1F:
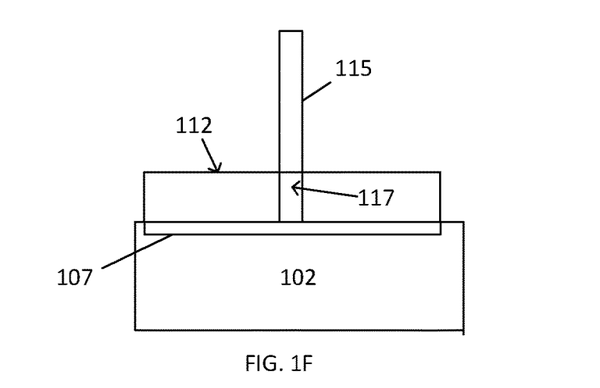
Figure 1G:
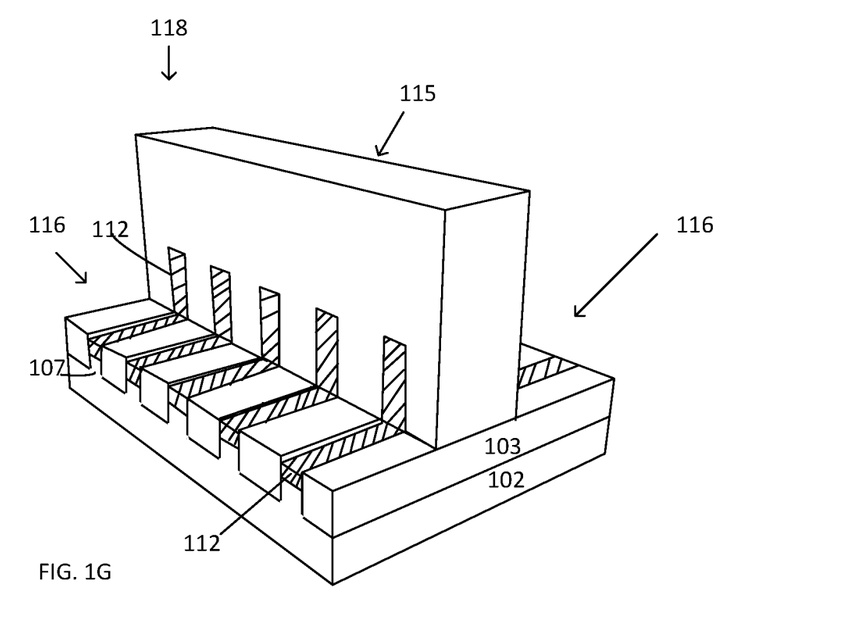
Figure 1H:
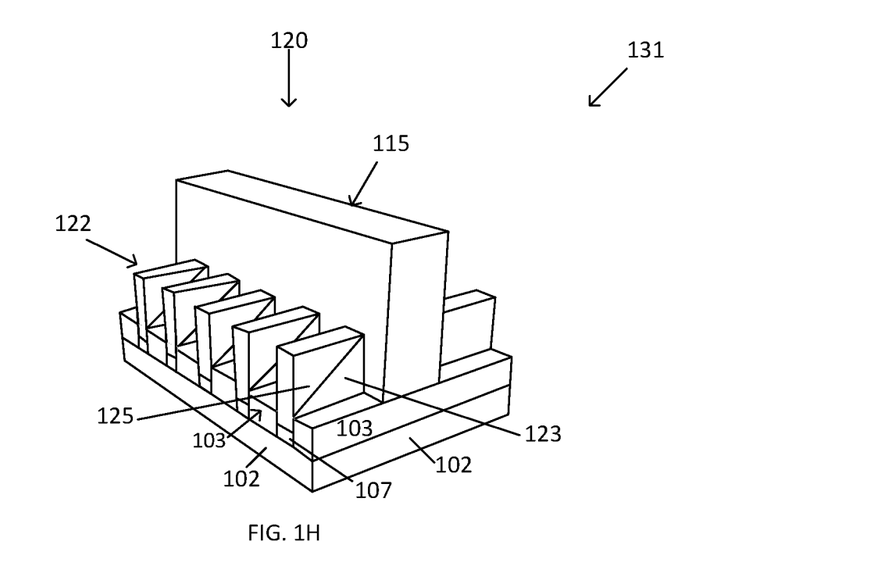
Figure 1J:
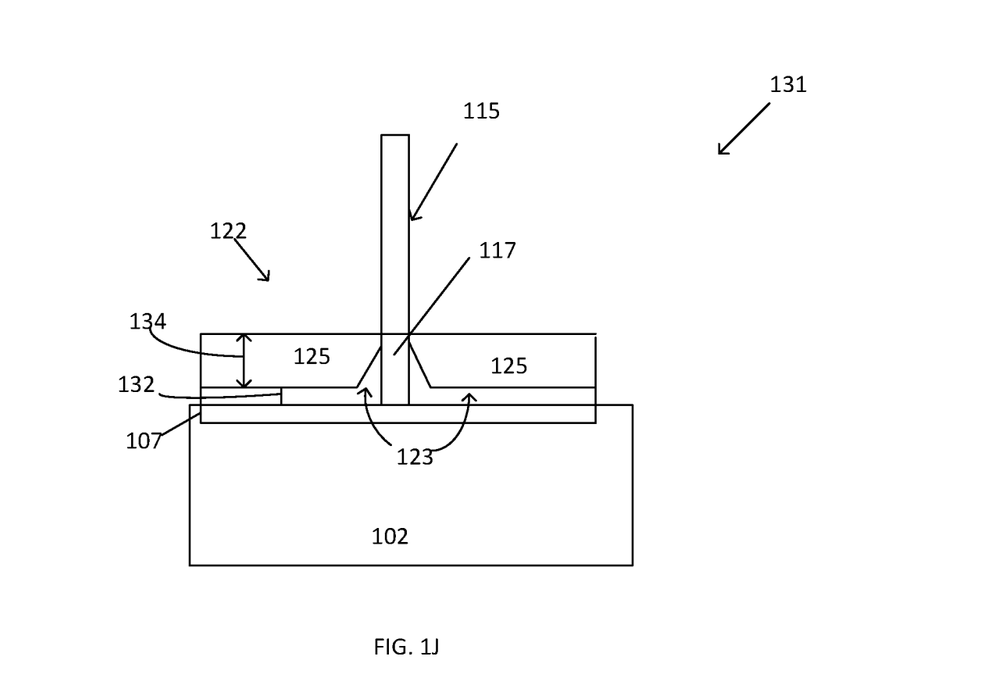
Figure 1K:
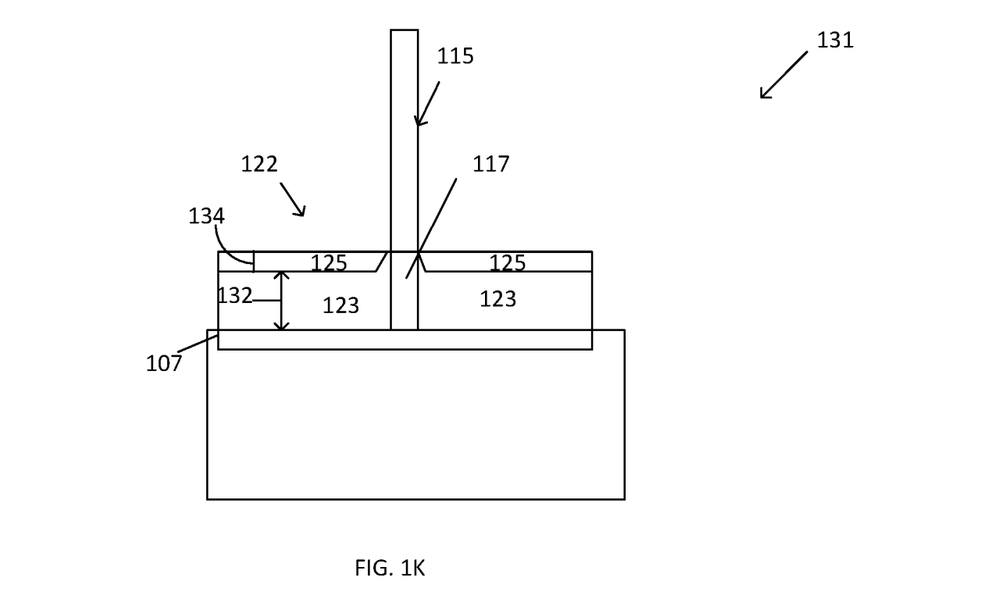
Figure 1L:
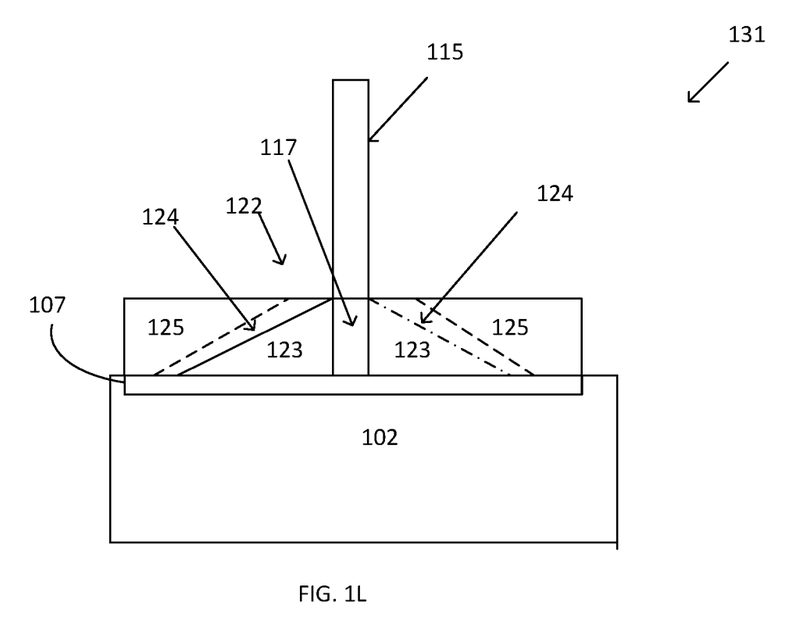
Figure 1M:
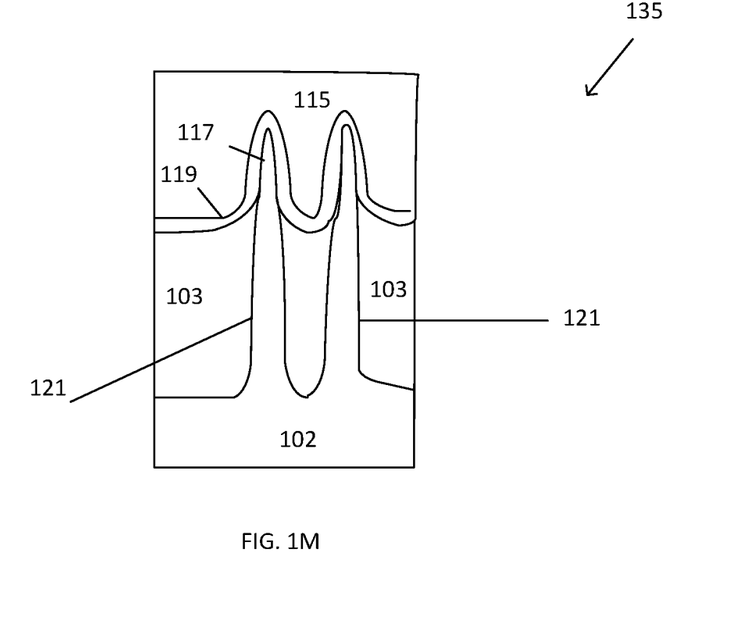
Figure 1N:
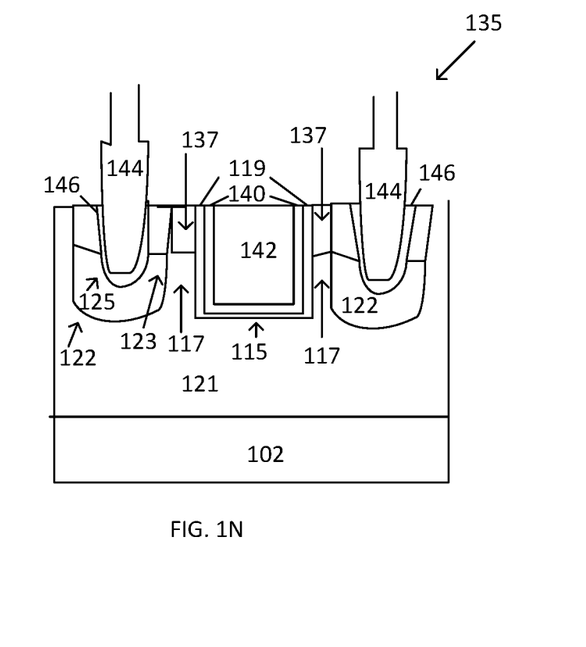

In FIGS. 1A-1N, side cross sectional views of structures and methods of forming germanium channel devices coupled with graded source/drain contact regions, are depicted. Such graded source/drain structures improve the transistor performance of germanium channel devices. In FIG. 1A, a device substrate 100, such as a transistor device substrate 100, may comprise fins 104. The fins 104 may comprise a silicon fins 104 in an embodiment, and may be formed/disposed in a substrate 102, such as a silicon substrate 102. The fins 104 may comprise sacrificial fins in an embodiment. The fins 104 may be adjacent to a dielectric material 103, such as a shallow trench isolation (STI) material, for example. The fins 104 may include opposing sidewalls 105 and a top surface 111.

In an embodiment, a portion of the fins 104 may be removed from the substrate 102 (FIG. 1B). In an embodiment, the fin 104 portion may be removed by using an etch process 106, such as a dry/wet etch process, or any suitable removal process. In an embodiment, an ammonium hydroxide based wet etch or a nitrogen fluoride based low ion energy dry etch, or an $SF_6$ based dry etch or a hydrogen bromide based dry etch may be employed. An opening/trench 108 is created wherein the removed portion of the fins 104 were previously located. In an embodiment, a portion 107 of the fin 104 may remain within/on the substrate 102, wherein the portion 107 may comprise a height 109. In another embodiment, the portion 107 of the fin 104 may not remain after the etch process 106, and may be substantially removed, such that the height 109 may be substantially zero.

In an embodiment, germanium fins 112 may be formed within the openings 108 (FIG. 1C). In an embodiment, the germanium fins 112 may be formed utilizing a germanium formation process 110. In an embodiment, the germanium formation process 110 may comprise a chemical vapor deposition (CVD) process or any other suitable deposition technique, and/or epitaxial formation processes. For example, the deposition/formation may be carried out by CVD, or rapid thermal CVD (RT-CVD), or low pressure CVD (LP-CVD), or ultra-high vacuum CVD (UHV-CVD), or gas source molecular beam epitaxy (GS-MBE) tools. In an embodiment, an array of germanium fins 112 may be formed within the substrate 102, and are separated from each other by the dielectric material 103. The array of germanium fins 112 may comprise a spacing 114 between individual germanium fins 112, in some cases, in a range of between about 100 nm to as little as 15 nm.

In an embodiment, the dielectric 103 may be recessed, by utilizing an etch process for example, such that a portion of the germanium fins 112 may be above the plane of the dielectric layer 103. (FIG. 1D). In an embodiment, the germanium fins 112 may comprise a height 113, and may be disposed on a portion of the substrate 102.

In an embodiment, a gate structure 115 may be formed on and around the array of germanium fins 112 (FIG. 1E). In an embodiment, the gate structure 115 may be fabricated by forming a gate dielectric layer (not shown) on or adjacent the germanium fin 112 upper surface 121 and on or adjacent to the laterally opposing germanium fin sidewalls 118, and then forming a gate electrode material on or adjacent the gate dielectric layer, either by a gate first or a gate last process flow, as will be understood to those skilled in the art. In an embodiment, the gate structure 115 comprises a gate material and/or gate materials that may surround each of the individual germanium fins 112. In an embodiment, the gate electrode material 115 may include a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. In an embodiment, a portion of the germanium fins 112 adjacent the gate structure 115 may comprise a source/drain region 116 of a non-planar device, for example. In an embodiment, a portion of the germanium fin 112 under the gate structure 115 may comprise a germanium channel region 117 (FIG. 1F, depicting a cross section through the germanium fin 112). In an embodiment, the germanium channel region may comprise greater than about 80 percent germanium. In another embodiment, the germanium channel region 117 may comprise substantially 100 percent germanium.

In an embodiment, an etch process 118 may remove a portion of the germanium fins 112 in the source drain regions 116 (FIG. 1G). In an embodiment, substantially all of the germanium material of the germanium fins 112 may be removed from the source/drain region 116, however in other embodiments, a portion of the germanium material may remain in the source/drain region 116 on the substrate 102.

In an embodiment, an array of graded source/drain structures 122 may be formed with a formation process 120 on the source/drain regions 116 (FIG. 1H). The deposition/formation may be carried out in a selective process by CVD, or rapid thermal CVD (RT-CVD), or low pressure CVD (LP-CVD), or ultra-high vacuum CVD (UHV-CVD), or gas source molecular beam epitaxy (GS-MBE) tools. In an embodiment, a portion of a device structure 131 may formed, which may comprise an n-type transistor device. In an embodiment, the graded source/drain structure 122 may comprise a high germanium concentration portion 123 disposed closest/adjacent to the germanium channel region 117, and may be directly adjacent the channel region 117 in some cases. In an embodiment, the germanium concentration of the high germanium concentration portion may comprise at least about 80 percent germanium, but may vary depending upon the particular application. In an embodiment, the high germanium concentration portion 123 may include an n-type dopant species, such as phosphorus or arsenic. The amount/concentration of germanium may decrease in the high germanium portion 123 as the distance away from the germanium channel region 117 increases, in an embodiment.

The graded source/drain structure 122 may comprise a high silicon concentration portion 125, wherein the silicon concentration may increase as the distance from the channel region 117 increases, in an embodiment. In an embodiment, the high silicon concentration portion may be adjacent a source/drain contact region, and may be directly adjacent the source/drain contact region, in some cases. In an embodiment, the silicon concentration of the high silicon concentration portion 125 may comprise at least about 80 percent silicon, but may vary depending upon the particular application. In an embodiment, the high silicon concentration portion 125 may comprise an in-situ doping of phosphorus, wherein the phosphorus concentration in the high silicon concentration portion is greater than the phosphorus concentration in the high germanium concentration 123 portion. For example, in an embodiment, a phosphorus concentration in the high germanium concentration portion 123 may comprise between about 0 to about $1 \times 10^{20}$ atoms per cm$^3$. In an embodiment, a phosphorus concentration in the high silicon concentration 125 may comprise about $1 \times 10^{21}$ atoms per cm$^3$ and above. In an embodiment, the amount/concentration of silicon may increase in the high silicon portion 125 as the distance away from the germanium channel region 117 increases.

In an embodiment, the high germanium concentration portion 123 may comprise a substantially smaller height 132 than a height 134 of the high silicon concentration portion 125 (FIG. 1J). In another embodiment, the high germanium concentration portion 123 may comprise a substantially larger height 132 than a height 134 of the high silicon concentration portion 125 (FIG. 1K). In an embodiment, the high silicon concentration portion 125 may be disposed above the high germanium concentration portion 125. In an embodiment, a region 124 between the high germanium concentration portion 123 and the high silicon concentration portion 125 may comprise a transition/interface region 124 (FIG. 1L). The transition region 124 may comprise a clear delineation between the two portions 123, 125 in an embodiment, but in other embodiments, there may be a less abrupt transition between the two portions, as shown in FIG. 1L, wherein the amount of grading between the germanium rich concentration and the silicon rich concentration in the transition region 124 may be optimized, according to the particular application.

In an embodiment, a portion of a device 135 (shown as an approximation of a transmission electron microscope (TEM) or Scanning electron microscope (SEM) cross section through the gate structure 115), similar to the non-planar transistor device 131 from FIG. 1H, for example, may comprise a germanium channel region 117, and may be surrounded by a gate structure 115 (FIG. 1M). The germanium channel region 117 disposed under the gate structure 115 may comprise substantially 100 percent germanium, in an embodiment. The germanium channel region 117 may comprise a portion of a germanium fin 121, and may be disposed on the substrate 102. Individual germanium fins 121 may be separated by the dielectric 103, which may comprise an STI material, for example. The gate material 115 may comprise multi layers (such as titanium, carbon, aluminum, a gate fill material etc.) and may be disposed on a gate dielectric material 119, such as a high-k gate dielectric material 119, such as an oxide formed from one or a combination of hafnium, aluminum, scandium and/or lanthanum, for example.

FIG. 1N depicts a cross section (similar to a TEM/SEM cross section) through the fin structure 121 of the transistor device 135. The device 135 includes a gate structure 115, that may comprise multilayers, such as a work function layer 140 and a fill metal layer 142, for example. In an embodiment, the gate structure 115 may comprise more or less layers, depending upon the particular application. In an embodiment, the gate structure 115 may comprise a nanowire structure or a nanoribbon structure. A gate dielectric layer, which may comprise a high k gate dielectric layer 119 in an embodiment, may be disposed/adjacent the gate structure 115. Gate spacers 137 may be adjacent the gate structure 115, and may comprise a pair of gate spacers on opposite sides of the gate structure 115, in an embodiment. Graded source/drain structures 122 may be adjacent the gate spacers and adjacent the gate structure 115.

The graded source/drain structures 122 may be coupled with source/drain contact structures 144, wherein the source/drain contact structures 144 may comprise a metal, such as tungsten, aluminum, copper, ruthenium or cobalt in an embodiment, and may further comprise TaN, TiN or other diffusion barrier liners 146. The liner 146 may additionally comprise a silicide or insulator material in an embodiment, and may be disposed between the source/drain contact structure 144 and the graded source/drain structure. In an embodiment, the graded source/drain structure 122 may comprise a high germanium concentration portion 123 closest to/adjacent to a germanium channel region 117, and may comprise a high silicon concentration portion 125 farther away from the germanium channel region 117. In an embodiment, the graded source/drain structure 122 may comprise a germanium concentration that is higher directly adjacent the germanium channel region 117, than at a source/drain contact interface region.

In an embodiment, the high germanium concentration portion 123 may be in direct contact with the germanium channel region 117. The silicon rich portion 125 that is closer to the source/drain contact structure 144 improves/decreases the contact resistance of the device 135. By providing the grading scheme of the graded source/drain structures 122 of the embodiments herein, an energy barrier of the silicon rich portion 125, which may comprises about 0.5 eV, may be in contact with the source/drain contact 144, and thus the contact resistance of the device 135 with respect to the metal contact may be greatly improved.

The embodiments herein enable improved channel mobility for germanium devices over silicon. The graded source/drain structures of the embodiments herein incorporates the functional phosphorus doped silicon to metal contact properties, while utilizing the germanium channel so that device performance is optimized in terms of current flow at a given source to drain voltage when the transistor is in the on state. The graded source/drain structures described herein may provide greater than twice an improvement in contact resistance. The graded source/drain structure embodiments herein are compatible with any kind of substrates, including bulk silicon, germanium. The embodiments can employ germanium transistors formed by blanket deposition or by ART trench fill. They can employ strain relaxed buffers (SRB) of any type, and are compatible with gate first or gate last processing. Furthermore, the source drain structures may be processed before isolation above source/drain or after isolation has been deposited and contact holes are drilled in an alternate embodiment.

Figure 2:
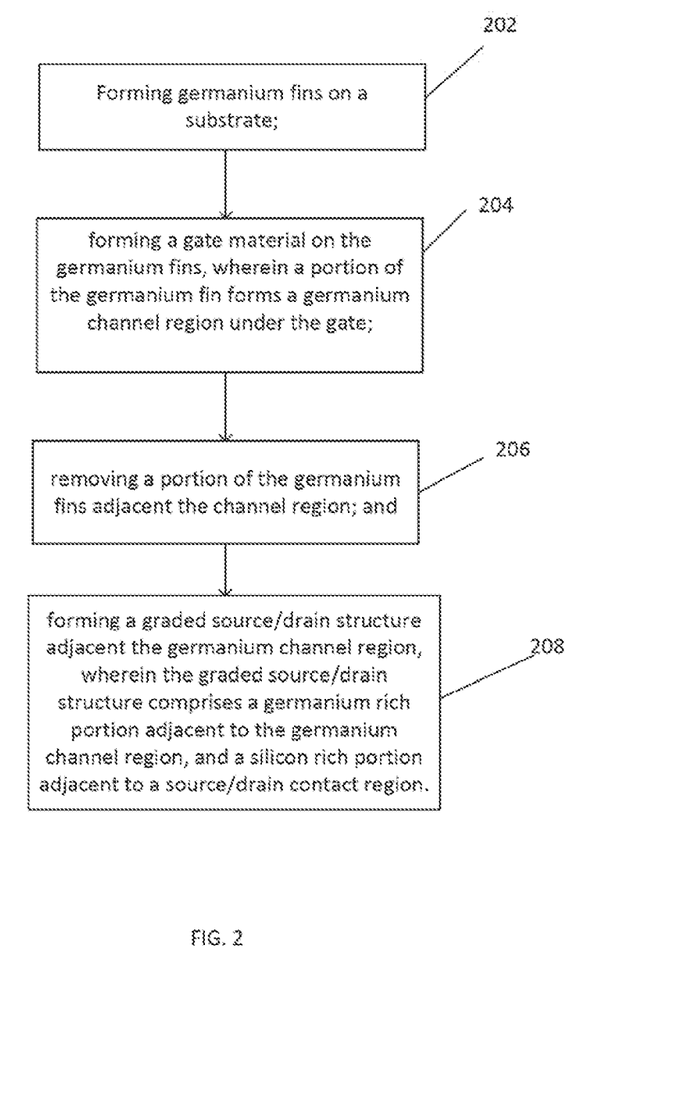
FIG. 2 represents a flow chart of a method according to embodiments.

FIG. 2 depicts a method according to embodiments herein. At step 202, germanium fins may be formed on a substrate. At step 204, a gate material may be formed on the germanium fins, wherein a portion of the germanium fin forms a germanium channel region under the gate. At step 206, a portion of the germanium fins adjacent the germanium channel region may be removed (in a source/drain region). At step 208, a graded source/drain region may be formed adjacent the germanium channel region, wherein the graded source/drain region comprises a germanium rich portion adjacent to the germanium channel region, and a silicon rich portion adjacent to a source/drain contact region. In addition, the graded source/drain structure may comprise an n-type dopant such as phosphorus, for example, wherein the phosphorus concentration is lower in the germanium rich portion than in the silicon rich portion.

In an embodiment, an insulating deposition process, may be employed, subsequent to the formation of the graded source/drain structures, which may comprise a gate oxide deposition or any other process that may serve to isolate the germanium channel region from the layer below. Metal gate fill, gate and trench contacts, and backend flow processes may be subsequently be performed, although the order and process details will be dependent upon the particular device architecture.

In an embodiment, the structures of the embodiments herein may be coupled with any suitable type of structures capable of providing electrical communications between a microelectronic device, such as a die, disposed in package structures, and a next-level component to which the package structures may be coupled (e.g., a circuit board).

The device structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. The structures/devices described in the various figures herein may comprise portions of a silicon logic die or a memory die, for example, or any type of suitable microelectronic device/die. In some embodiments the devices may further comprise a plurality of dies, which may be stacked upon one another, depending upon the particular embodiment. In an embodiment, the die(s) may be partially or fully embedded in a package structure.

The various embodiments of the device structures included herein may be used for system on a chip (SOC) products, and may find application in such devices as smart phones, notebooks, tablets, wearable devices and other electronic mobile devices. In various implementations, the package structures may be included in a laptop, a netbook, a notebook, an ultrabook, a smartphone, a tablet, a personal digital assistant (PDA), an ultra mobilePC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

The embodiments herein enable a significantly improved contact resistance between metal contacts and source/drain structures, by reducing the energy barrier between the metal and the graded source/drain regions. The various embodiments serve to eliminate high contact resistance for n-type devices, and enable the fabrication of cost-effective and massively scaled MOS and TFET devices with integrated germanium based channel electron transport (n-type) transistors.

Figure 3:
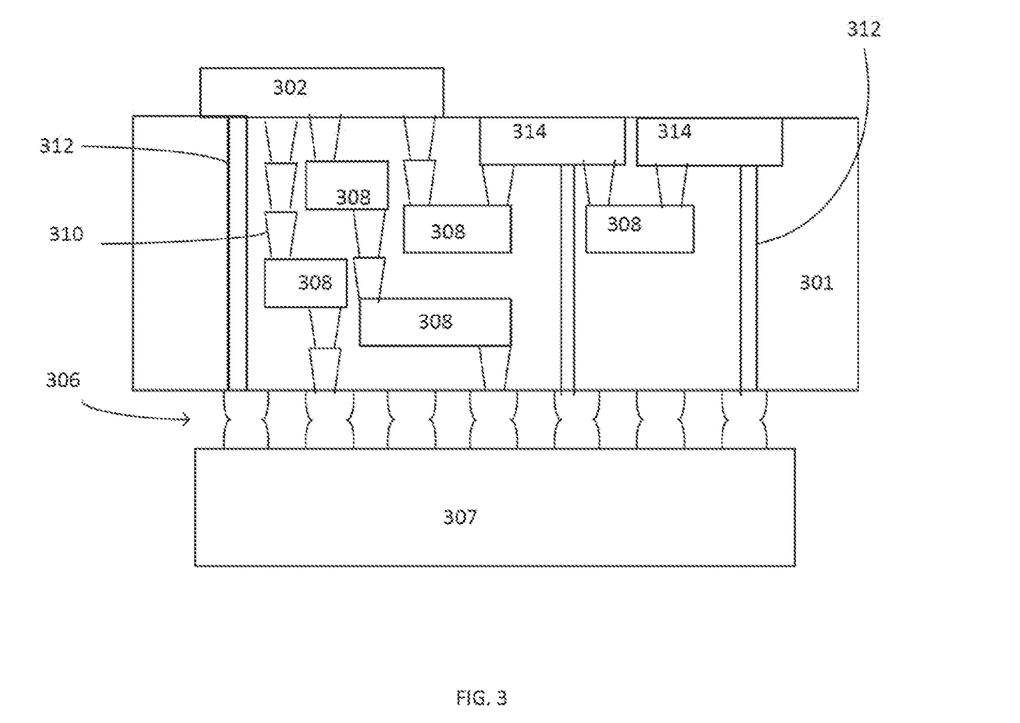
FIG. 3 represents an interposer implementing one or more embodiments.

FIG. 3 illustrates a device 300 that includes one or more embodiments included herein. The device 300 may include interposer 301, which may comprise an intervening substrate used to bridge a first substrate 302 to a second substrate 307. The first substrate 302 may be, for instance, any type of integrated circuit die, and may include embodiments of the graded source/drain structures described herein, and may comprise a memory device, in an embodiment. The second substrate 304 may be, for instance, a memory module, a computer motherboard, a processor device, or any other integrated circuit die, and may include embodiments of the graded source/drain structures described herein. Generally, the purpose of an interposer 301 is to spread a connection to a wider pitch or to reroute a connection to a different connection.

For example, an interposer 301 may couple an integrated circuit die to a ball grid array (BGA) 506 that can subsequently be coupled to the second substrate 304. In some embodiments, the first and second substrates 302/307 are attached to opposing sides of the interposer 301. In other embodiments, the first and second substrates 302/307 are attached to the same side of the interposer 301. And in further embodiments, three or more substrates are interconnected by way of the interposer 301.

The interposer 301 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials. The interposer may include metal interconnects 308 and vias 310, and may also include through-silicon vias (TSVs) 312. The interposer 301 may further include embedded devices 314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 301. In accordance with embodiments, apparatuses or processes disclosed herein may be used in the fabrication of interposer 301.

Figure 4:
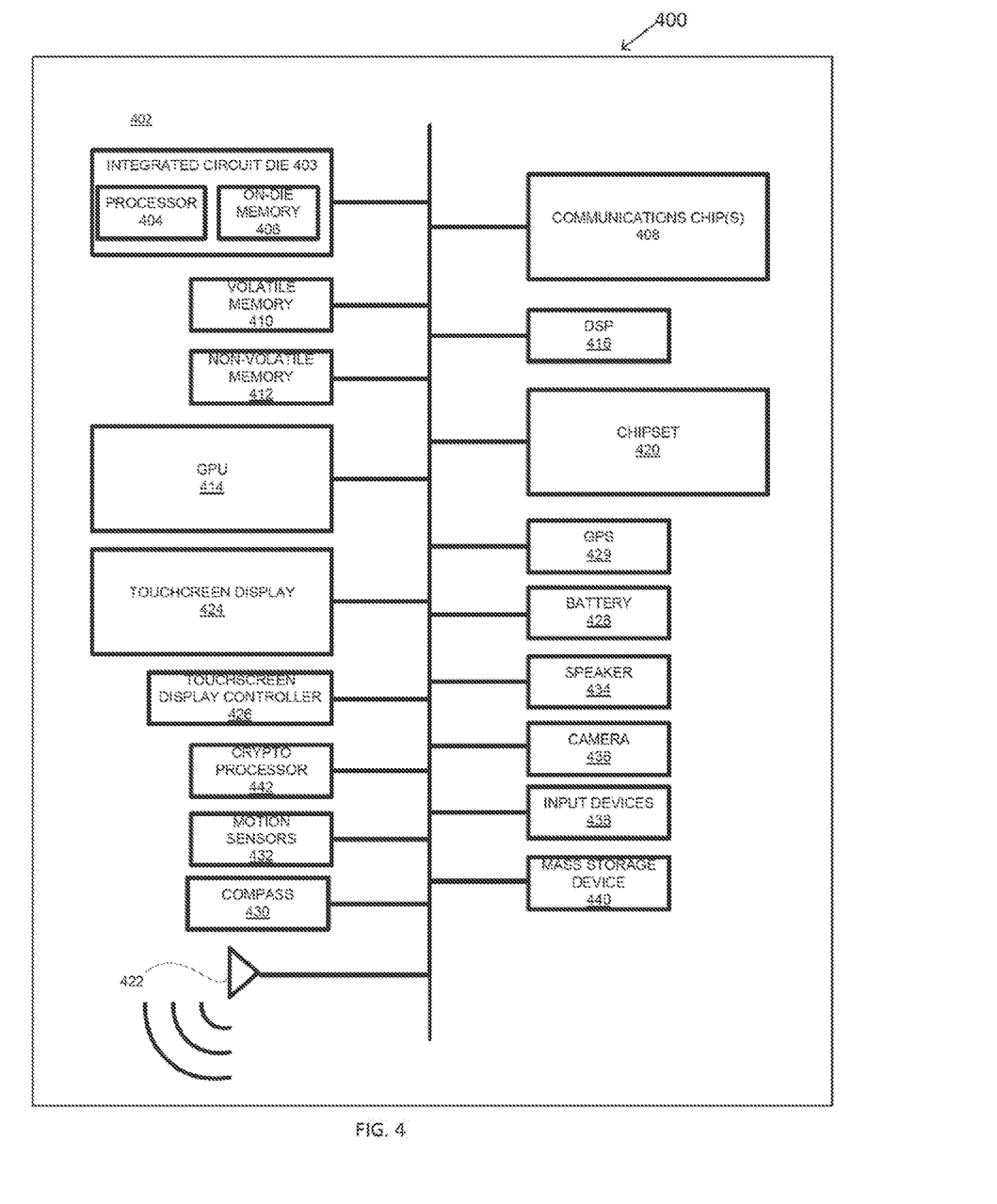
FIG. 4 represents a schematic of a system according to embodiments.

FIG. 4 is a schematic of a computing device 400 according to an embodiment. In an embodiment, the computing device 400 houses a board 402, such as a motherboard 402 for example. The board 402 may include a number of components, including but not limited to a processor 404, and an on-die memory 406, that may be communicatively coupled with an integrated circuit die 403, and at least one communication chip 408. The processor 404 may be physically and electrically coupled to the board 402. In some implementations the at least one communication chip 408 may be physically and electrically coupled to the board 402. In further implementations, the communication chip 406 is part of the processor 404.

Depending on its applications, computing device 400 may include other components that may or may not be physically and electrically coupled to the board 402, and may or may not be communicatively coupled to each other. These other components include, but are not limited to, volatile memory (e.g., DRAM) 410, non-volatile memory (e.g., ROM) 412, flash memory (not shown), a graphics processor unit (GPU) 414, a digital signal processor (DSP) 416, a crypto processor 442, a chipset 420, an antenna 422, a display 424 such as a touchscreen display, a touchscreen controller 426, a battery 428, an audio codec (not shown), a video codec (not shown), a global positioning system (GPS) device 429, a compass 430, accelerometer, a gyroscope and other inertial sensors 432, a speaker 434, a camera 436, various input devices 438 and a mass storage device (such as hard disk drive, or solid state drive) 440, compact disk (CD) (not shown), digital versatile disk (DVD) (not shown), and so forth). These components may be connected to the system board 402, mounted to the system board, or combined with any of the other components.

The communication chip 408 enables wireless and/or wired communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 408 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 400 may include a plurality of communication chips 408. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 400 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

EXAMPLES

Example 1 is a microelectronic structure comprising a substrate, wherein the substrate comprises silicon, a germanium fin disposed on the substrate, wherein a portion of the germanium fin comprises a germanium channel region, a graded source/drain structure on the substrate adjacent the germanium channel region, and a gate material on the germanium channel region, wherein the graded source/drain structure comprises a germanium concentration that is higher adjacent the germanium channel region than at a source/drain contact region.

In Example 2, the structure of Example 1 including wherein the germanium concentration of the graded source/drain structure comprises greater than about 80 percent germanium adjacent the channel region.

In Example 3, the structure of Example 1 including wherein the graded source/drain structure comprises a silicon rich portion adjacent the source/drain contact region.

In Example 4, the structure of Example 3 including wherein the silicon rich region comprises a phosphorus doping concentration of greater than about 1×E21 atoms per $cm^3$.

In Example 5, the structure of Example 1 including wherein the graded source/drain structure comprises a germanium rich portion that is thicker than a silicon rich portion, wherein the silicon rich portion is above the germanium rich portion.

In Example 6, the structure of Example 1 including wherein the graded source/drain structure comprises a germanium rich portion that is thinner than a silicon rich portion, wherein the silicon rich portion is above the germanium rich portion.

In Example 7, the structure of Example 1 including wherein the graded source/drain structure comprises a transition region between a high germanium concentration portion and a high silicon concentration portion.

In Example 8 the structure of Example 7 wherein a phosphorus dopant concentration in the high germanium concentration portion is less than about 1×E20 atoms per $cm^3$.

Example 9 is a device structure comprising: a silicon substrate, a germanium fin on the substrate, wherein the germanium fin comprises a germanium channel region, a source/drain structure on the substrate, wherein the source/drain structure is coupled to the germanium fin structure, a high germanium concentration portion of the source/drain structure adjacent the germanium channel region, wherein the germanium concentration of the high germanium concentration portion is lower adjacent a source/drain contact region, a metal gate structure on the germanium channel region, and a source/drain contact coupled with the a high silicon concentration portion of the source/drain structure.

In Example 10, The device of Example 9 wherein an n-type dopant concentration in the high germanium concentration portion comprises below about 1×E20 atoms per $cm^3$.

In Example 11, the device of Example 9 wherein the high germanium concentration portion is doped with an n type dopant.

In Example 12, the device of Example 9 wherein the device comprises a portion of a NMOS transistor structure.

In Example 13, the device of Example 9 wherein the source/drain structure comprises a transition region, wherein the transition region is between the high germanium concentration portion and the high silicon concentration portion.

In Example 14, the device of Example 9 further comprising wherein the high silicon concentration portion comprises an n-type dopant concentration of greater than about 1×E21 atoms per cm$^3$.

In Example 15, the device of claim 9 wherein the high silicon concentration portion comprises an in situ doped phosphorus species.

In Example 16, the device of Example 9 wherein the device structure comprises a nanowire or a nanoribbon transistor structure.

Example 17 is a method of forming a microelectronic structure, comprising: forming a germanium fin on a substrate, forming a gate material on the germanium fin, wherein a portion of the germanium fin comprises a channel region of a device, and forming a source/drain structure adjacent to the germanium channel region, wherein a germanium rich portion of the source/drain structure is formed adjacent to the channel region, and wherein a silicon rich portion of the source/drain structure is formed adjacent to a source/drain contact region.

In Example 18 the method of Example 17 further comprising wherein the source/drain structure is doped with an n-type dopant.

In Example 19, the method of Example 17 further comprising wherein the germanium rich portion comprises an n-type dopant concentration of less than about 1E20 atoms per cm$^3$.

In Example 20, the method of Example 17 further comprising wherein the silicon rich portion comprises an n-type dopant concentration of greater than about 1E21 atoms per cm$^3$.

In Example 21 the method of Example 17 further comprising wherein the source/drain structure comprises a transition region, wherein the transition region is formed between the high germanium concentration portion and the high silicon concentration portion.

In Example 22 the method of Example 17, further comprising wherein the germanium rich portion comprises a smaller height than the silicon rich portion.

In Example 23, the method of Example 17 further comprising wherein the device comprises a portion of one of a FINFET, a tri-gate, nanowire, nanoribbon or a planar transistor structure.

In Example 24 the method of Example 17 further comprising wherein the germanium rich portion comprises a larger height than the silicon rich portion.

In Example 25, the method of Example 17 further comprising wherein the device comprises an NMOS device.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A microelectronic structure comprising:
   a substrate, wherein the substrate comprises silicon;
   a fin comprising germanium on the substrate, wherein a portion of the fin comprises a channel region, wherein the channel region comprises germanium;
   a source region and a drain region, the source region comprising a graded source region, and the drain region comprising a graded drain region, the source region on the substrate adjacent the channel region, and the drain region on the substrate adjacent the channel region, opposite the source region; and
   a gate material on the channel region, wherein the source region comprises a germanium concentration that is higher adjacent the channel region than at a source contact region and comprises a silicon rich portion adjacent to the source contact region, and wherein the drain region comprises a germanium concentration that is higher adjacent the channel region than at a drain contact region, and comprises a silicon rich portion adjacent to the drain contact region, and wherein each of the silicon rich portions comprises phosphorus at a concentration of greater than about 1×10$^{21}$ atoms per cm$^3$.

2. The structure of claim 1 wherein the germanium concentration of the source region and the germanium concentration of the drain region each individually comprises greater than about 80 percent germanium adjacent the channel region.

3. The structure of claim 1 wherein the source region comprises a germanium rich portion and the drain region comprises a germanium rich portion, wherein a thickness of the germanium rich portion is greater than a thickness of a silicon rich portion, wherein the silicon rich portion is above the germanium rich portion.

4. The structure of claim 1 wherein the source region and the drain region each individually comprises a germanium rich portion, wherein a thickness of the germanium rich portion is less than a thickness of a silicon rich portion, wherein the silicon rich portion is above the germanium rich portion.

5. The structure of claim 1 wherein the each of the source region and the drain region each individually comprises a transition region between a high germanium concentration portion and a high silicon concentration portion.

6. The structure of claim 5 wherein a phosphorus dopant concentration in the high germanium concentration portion is less than about 1×10$^{20}$ atoms per cm$^3$.

7. A device structure comprising:
   a substrate comprising silicon;
   a fin comprising germanium on the substrate, wherein the fin comprises a channel region, wherein the channel region comprises germanium;
   a source region and a drain region on the substrate, wherein the source region and the drain region are coupled to the fin structure;
   a high germanium concentration portion of the source region and a high germanium concentration portion of the drain region adjacent the channel region, wherein the germanium concentration of the high germanium concentration portion of the source region is lower adjacent a source contact region and the germanium concentration of the high germanium concentration portion of the drain region is lower adjacent a drain contact region;

a gate structure comprising metal on the channel region;
wherein the source contact region is coupled with a high silicon concentration of the source region and the drain contact region is coupled with a high silicon concentration portion of the drain region, and wherein the high germanium concentration portion of the source region and the high germanium concentration portion of the drain region are doped with an n-type dopant.

8. The device structure of claim 7 wherein an n-type dopant concentration in the high germanium concentration portion of the source region and the high germanium concentration portion of the drain region each individually comprises below about $1 \times 10^{20}$ atoms per $cm^3$.

9. The device of claim 7 wherein the device comprises a portion of an NMOS transistor structure.

10. The device of claim 7 wherein the source region and the drain region each individually comprises a transition region, wherein the transition region is between the high germanium concentration portion and the high silicon concentration portion.

11. The device of claim 7 wherein the high silicon concentration portion of the source region and the high silicon concentration portion of the drain region each individually comprises an n-type dopant concentration of greater than about $1 \times 10^{21}$ atoms per $cm^3$.

12. The device of claim 7 wherein the high silicon concentration portion of the source region and the high silicon concentration portion of the drain region each individually comprises phosphorus.

13. The device of claim 7 wherein the device structure comprises a nanowire or a nanoribbon transistor structure.

14. A method of forming a microelectronic structure, comprising:
forming a fin comprising germanium on a substrate;
forming a gate material on the fin, wherein a portion of the fin comprises a channel region of a device, the channel region comprising germanium; and
forming a source region and a drain region adjacent to the channel region, wherein the source region and the drain region comprise an n-type dopant, and wherein a germanium rich portion of the source region and a germanium rich portion of the drain region are formed adjacent to the channel region, and wherein a silicon rich portion of the source region is formed adjacent to a source contact region and a silicon rich portion of the drain region is formed adjacent to a drain contact region.

15. The method of claim 14 further comprising wherein the germanium rich portion of the source region and the germanium rich portion of the drain region comprises an n-type dopant concentration of less than about $1 \times 10^{20}$ atoms per $cm^3$.

16. The method of claim 14 wherein the silicon rich portion of the source region and the silicon rich portion of the source region comprises an n-type dopant concentration of greater than about $1 \times 10^{21}$ atoms per $cm^3$.

17. The method of claim 14 further comprising wherein the source region and the drain region each individually comprises a transition region, wherein the transition region is formed between the high germanium concentration portion and the high silicon concentration portion.

18. The method of claim 14, further comprising wherein the germanium rich portion of the source region and the germanium rich portion of the drain region comprises a thickness that is less than a thickness of the silicon rich portion.

19. The method of claim 14 further comprising wherein the device comprises a portion of one of a FinFET, a tri-gate, nanowire, nanoribbon or a planar transistor structure.

20. The method of claim 14 further comprising wherein the germanium rich portion of the source region and the germanium rich portion of the drain region comprises a thickness that is greater than a thickness of the silicon rich portion.

21. The method of claim 14 wherein the device comprises an NMOS device.

\* \* \* \* \*